United States Patent
Chao et al.

(10) Patent No.: US 10,307,775 B2
(45) Date of Patent: Jun. 4, 2019

(54) ADHESIVE DISPENSING APPARATUS

(71) Applicant: AVISION INC., Hsinchu (TW)

(72) Inventors: Chien-Peng Chao, Penghu County (TW); Zhong-Feng Pan, Hsinchu County (TW)

(73) Assignee: AVISION INC., Hsinchu (TW)

( * ) Notice: Subject to any disclaimer, the term of this patent is extended or adjusted under 35 U.S.C. 154(b) by 0 days.

(21) Appl. No.: 15/867,533

(22) Filed: Jan. 10, 2018

(65) Prior Publication Data

US 2018/0207657 A1    Jul. 26, 2018

(30) Foreign Application Priority Data

Jan. 25, 2017  (TW) .............................. 106201500 U

(51) Int. Cl.
| | |
|---|---|
| *B05B 9/00* | (2006.01) |
| *B05B 9/03* | (2006.01) |
| *B05B 13/04* | (2006.01) |
| *C09J 5/00* | (2006.01) |
| *H01L 21/00* | (2006.01) |

(52) U.S. Cl.
CPC ................ *B05B 9/03* (2013.01); *B05B 9/002* (2013.01); *B05B 13/04* (2013.01); *C09J 5/00* (2013.01); *H01L 21/00* (2013.01); *C09J 2201/61* (2013.01)

(58) Field of Classification Search
USPC ................................ 118/300, 302, 323, 305
See application file for complete search history.

(56) References Cited

U.S. PATENT DOCUMENTS

| | | | | |
|---|---|---|---|---|
| 3,317,368 A | * | 5/1967 | Battersby | .............. B29B 13/022 |
| | | | | 428/373 |
| 2016/0122592 A1 | * | 5/2016 | Das | ....................... B05C 5/0279 |
| | | | | 222/1 |

* cited by examiner

*Primary Examiner* — Yewebdar T Tadesse
(74) *Attorney, Agent, or Firm* — Maschoff Brennan

(57) ABSTRACT

An adhesive dispensing apparatus comprises a base, a carrier and a feeding assembly. The carrier is rotatably disposed on the base, and the carrier configured for containing an adhesive material. The feeding assembly is disposed between the base and the carrier. The feeding assembly comprises a guide roller set, a conduit and a nozzle. One end of the conduit is connected to the nozzle, and another end of the conduit corresponds to the guide roller set. In addition, the guide roller set is configured for feeding the adhesive material through the conduit to the nozzle.

6 Claims, 3 Drawing Sheets

ADHESIVE DISPENSING APPARATUS

CROSS-REFERENCE TO RELATED APPLICATIONS

This non-provisional application claims priority under 35 U.S.C. § 119(a) on Patent Application No(s). 106201500 filed in Taiwan, R.O.C. on Jan. 25, 2017, the entire contents of which are hereby incorporated by reference.

TECHNICAL FIELD

The disclosure relates to an adhesive dispensing apparatus, more particularly to an automatic adhesive dispensing apparatus.

BACKGROUND

In the production of electronic products, the electronic products should be applied with adhesive for adhering components. Since the components and the circuit layouts of the electronic products become much more compact, a demand of quality of dispensing adhesive is getting higher.

SUMMARY

One embodiment of the disclosure provides an adhesive dispensing apparatus comprising a base, a carrier and a feeding assembly. The carrier is rotatably disposed on the base, and the carrier configured for containing an adhesive material. The feeding assembly is disposed between the base and the carrier. The feeding assembly comprises a guide roller set, a conduit and a nozzle. One end of the conduit is connected to the nozzle, and another end of the conduit corresponds to the guide roller set. In addition, the guide roller set is configured for feeding the adhesive material through the conduit to the nozzle.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
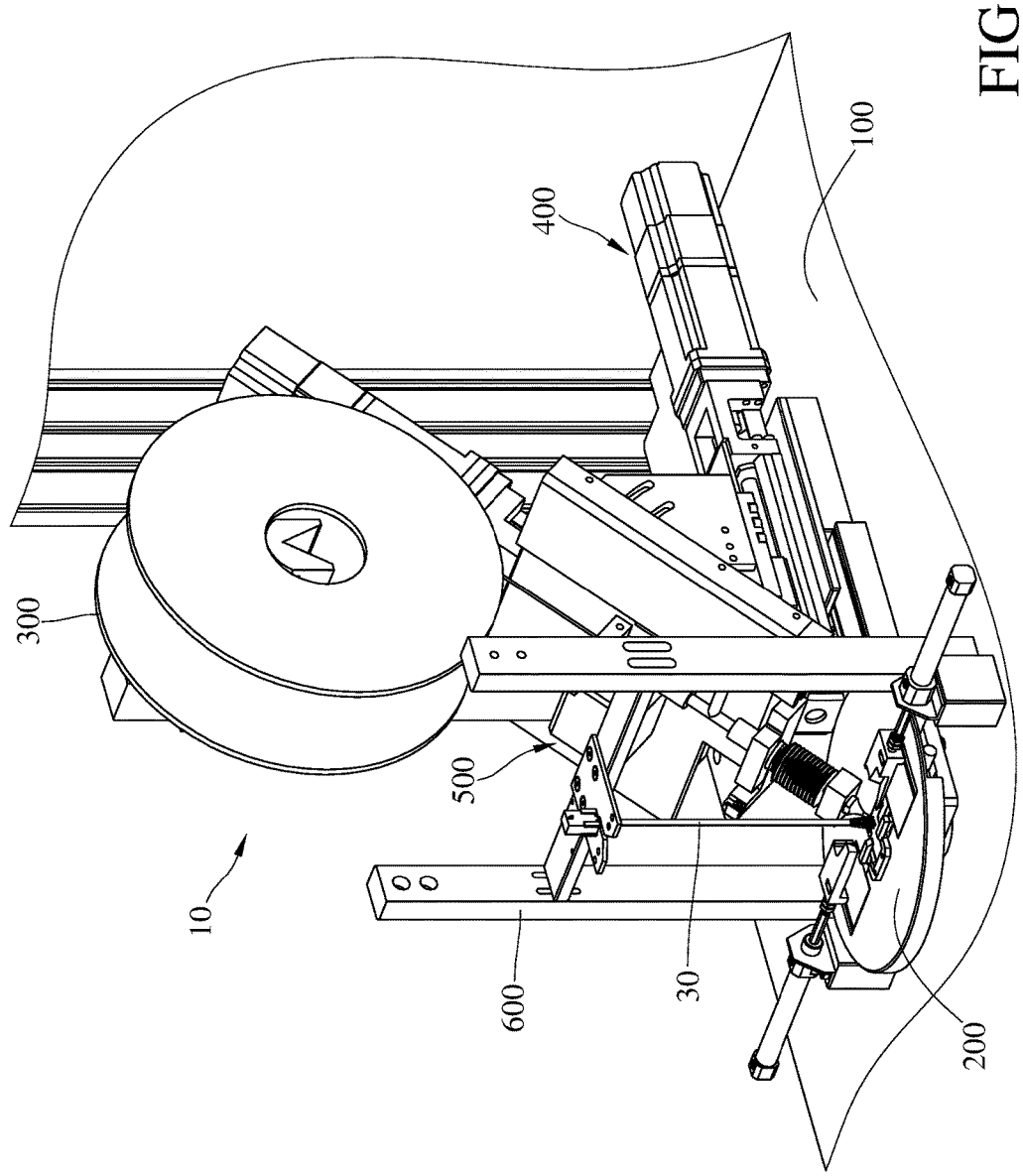
FIG. 1 is a perspective view of an adhesive dispensing apparatus in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
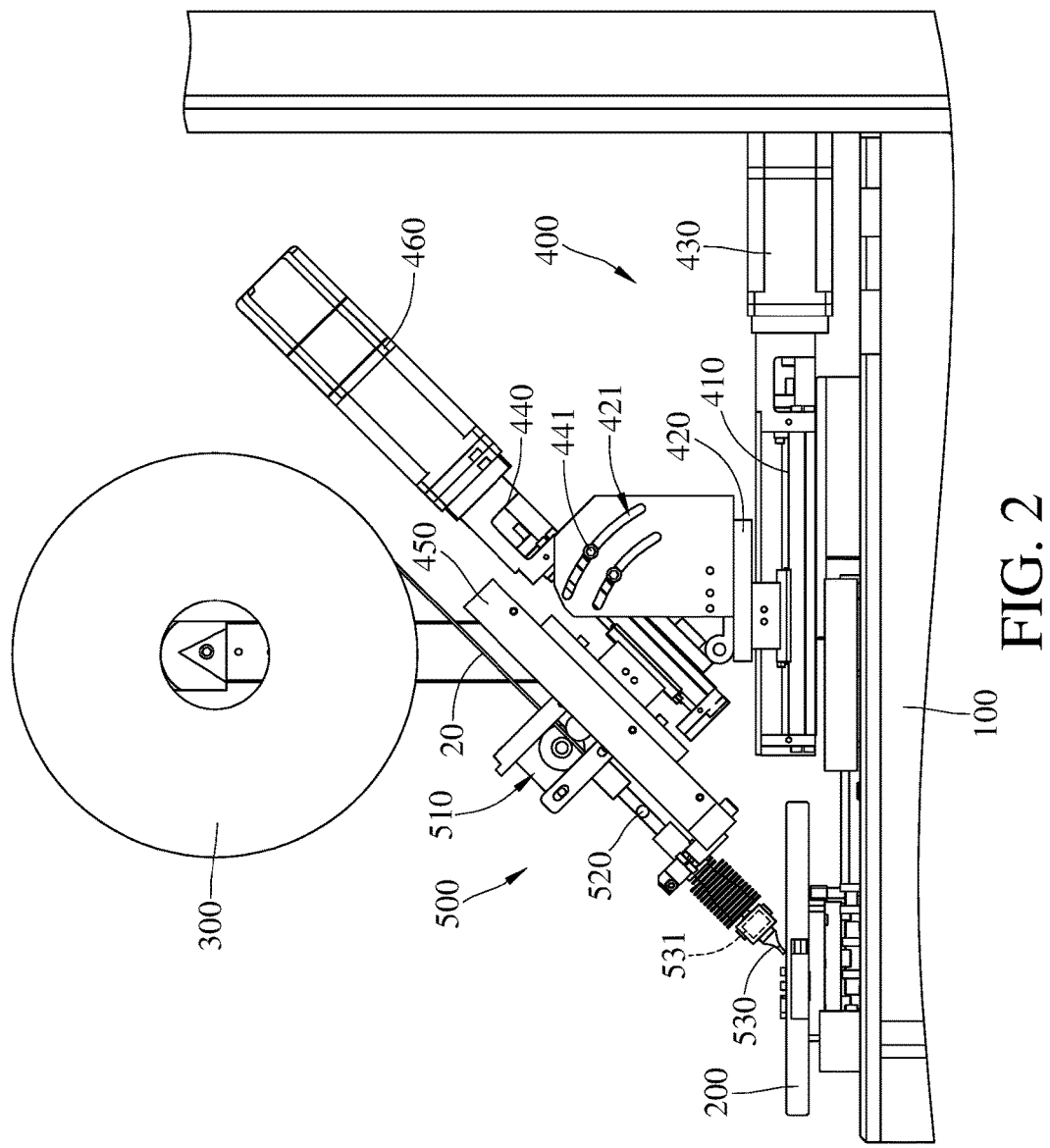
FIG. 2 is a side view of the adhesive dispensing apparatus in FIG. 1 without a fixing frame.
Figure 3:
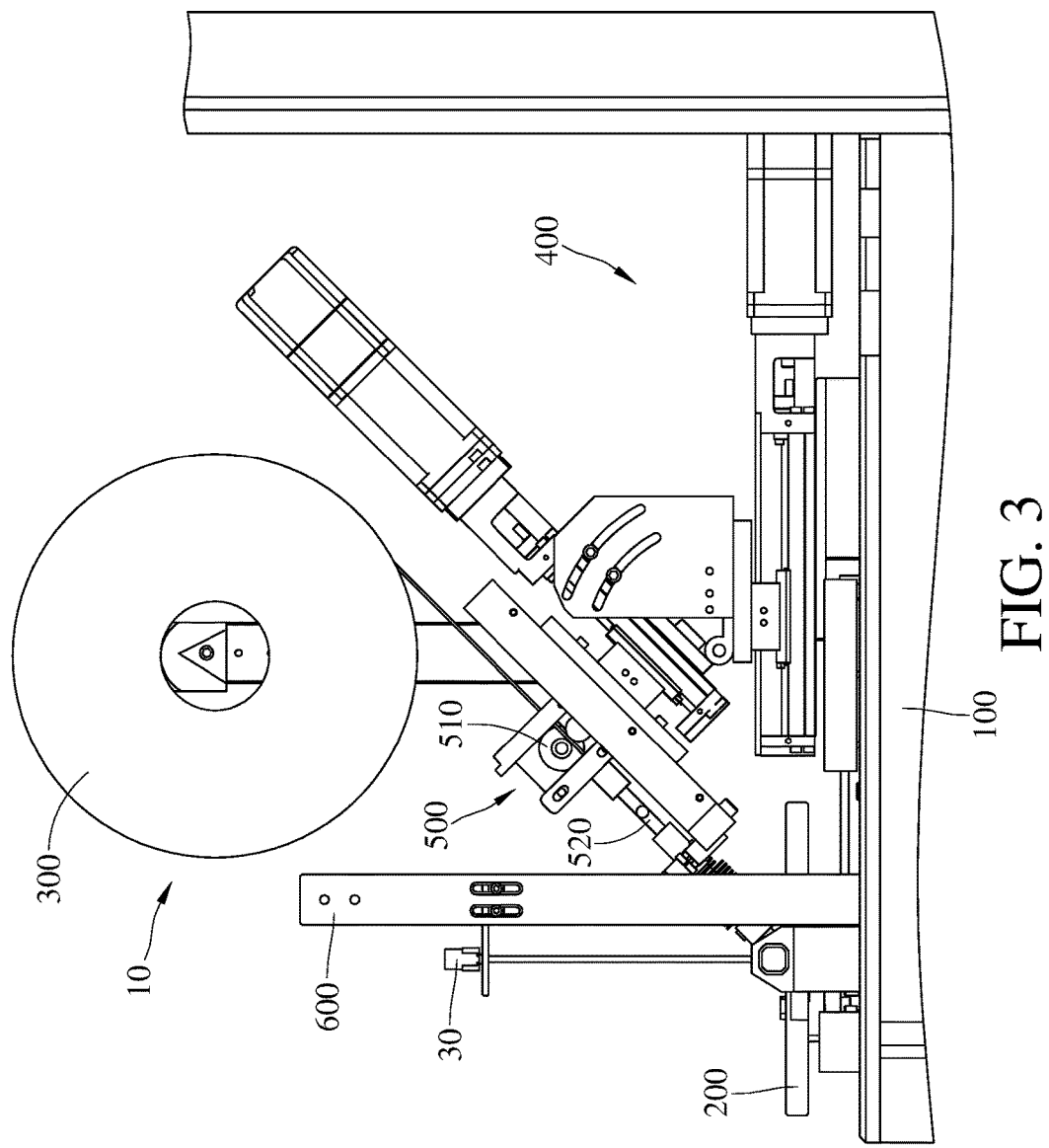
FIG. 3 is side view of the adhesive dispensing apparatus in FIG. 1.

Please refer to FIG. 1 to FIG. 3. FIG. 1 is a perspective view of an adhesive dispensing apparatus in accordance with one embodiment of the disclosure. FIG. 2 is a side view of the adhesive dispensing apparatus in FIG. 1 without a fixing frame. FIG. 3 is side view of the adhesive dispensing apparatus in FIG. 1.

In this embodiment, an adhesive dispensing apparatus 10 is provided. The adhesive dispensing apparatus 10 includes a base 100, a carrier 300 and a feeding assembly 500. The carrier 300 is, for example, a spool or the like designed for thread or other flexible materials to be wound thereon, but the disclosure is not limited to the configuration of the carrier.

The base 100 is configured for holding a printed circuit board 200.

The carrier 300 is rotatably located above the base 100, and configured for containing an adhesive material 20. The adhesive material 20 is, for example, a flexible hot-melt adhesive, and is able to be wound on the carrier 300. In this embodiment, the carrier 300 is located above the base 100, but the present disclosure is not limited thereto. In other embodiments, the carrier 300 may be underneath the base 100.

The feeding assembly 500 is disposed between the base 100 and the carrier 300. The feeding assembly 500 includes a guide roller set 510, a conduit 520 and a nozzle 530. One end of the conduit 520 is connected to the nozzle 530, and the other end of the conduit 520 corresponds to the guide roller set 510. The guide roller set 510 includes at least two rollers. The rollers are rotatable, and are configured to press the adhesive material 20 from two sides. The feeding assembly 500 further includes a heater 531 on the bottom of the nozzle 530, and the heater 531 is configured for heating the adhesive material 20 so as to change the adhesive material 20 from a solid state to a liquid state. When the rollers of the guide roller set 510 rotate, the adhesive material 20 is fed through the conduit 520 to the nozzle 530, and is melted by the heater 531 before getting to the nozzle 530.

Accordingly, in this embodiment, the carrier 300 is rotatably located above the base 100, and the adhesive material 20 can be wound on the carrier 300, so that operators can determine the amount of the adhesive material 20 to be wound on the carrier 300 according to actual requirements. For example, the operator can prepare a greater amount of adhesive material 20 for a large-scale dispensing process, so that the carrier 300 does not need to be reloaded with the adhesive material 20 during the adhesive dispensing process. It is noted that the operator can only prepare a small amount of the adhesive material 20 for a small-scale dispensing process.

In this and other embodiments, the adhesive dispensing apparatus 10 further includes a position adjusting mechanism 400 connected to the feeding assembly 500 and the base 100 in order to drive the feeding assembly 500 to move relative to the base 100.

In detail, in this embodiment, the position adjusting mechanism 400 includes a first guide rail 410, a first slide block 420, a first driving component 430, a second guide rail 440, a second slide block 450 and a second driving component 460. The first guide rail 410 is fixed to the base 100. The first slide block 420 is slidably disposed on the first guide rail 410. The first driving component 430 is configured to drive the first slide block 420 to slide relative to the first guide rail 410. The second guide rail 440 is rotatably disposed on the first slide block 420. The second guide rail 440 is disposed on the first slide block 420. The second slide block 450 is slidably disposed on the second guide rail 440.

The second driving component 460 is configured to drive the second slide block 450 to slide relative to the second guide rail 440.

In this embodiment, the second guide rail 440 includes a plurality of slide blocks 441. The first slide block 420 has a plurality of grooves 421. The slide blocks 441 are slidably disposed in the grooves 421, such that the second guide rail 440 is rotatably disposed on the first slide block 420. Therefore, a sliding direction of the second slide block 450 can be changed to be the same as or different from a sliding direction of the first slide block 420 in order to move the nozzle 530 to required positions.

In this embodiment, the second guide rail 440 is rotatably disposed on the first slide block 420, but the present disclosure is not limited thereto. In other embodiments, the second guide rail 440 may be immovably fixed to the first slide block 420.

In this embodiment, a wire 30 is able to be fixed on a fixing frame 600 and maintained above the printed circuit board 200. One end of the wire 30 is near the printed circuit board 200, so that the wire 30 is able to be fixed to the printed circuit board 200 by the liquid adhesive material flowing from the nozzle 530. In addition, the adhesive dispensing apparatus 10 may further be equipped with a fan for generating air flow to a place where the adhesive material is dispensed in order to dry the adhesive material faster, thereby increasing the efficiency of adhesive dispensing process.

In addition, in this embodiment, the position adjusting mechanism 400 includes two guide rails and two slide blocks, but the present disclosure is not limited thereto. In other embodiments, the position adjusting mechanism may only include one guide rail and slide block set; in such a case, the guide rail is fixed to the base, the slide block is slidably disposed on the guide rail, and the feeding assembly is fixed to the slide block.

According to the adhesive dispensing apparatus as described above, the carrier is rotatably located above the base, and the adhesive material can be wound on the carrier, so that operators can determine the amount of the adhesive material to be wound on the carrier according to actual requirements. For example, the operator can prepare a greater amount of the adhesive material for a large-scale dispensing process, so that the carrier does not need to be reloaded with the adhesive material during the adhesive dispensing process.

In addition, the nozzle is able to be moved to required positions by being driven by the position adjusting mechanism.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. An adhesive dispensing apparatus, comprising:
   a base;
   a carrier rotatably disposed on the base, and the carrier configured for containing an adhesive material;
   a feeding assembly disposed between the base and the carrier, the feeding assembly comprising a guide roller set, a conduit and a nozzle, one end of the conduit connected to the nozzle, and another end of the conduit corresponding to the guide roller set; and
   a position adjusting mechanism comprising a first guide rail, a first slide block and a first driving component, wherein the first guide rail is fixed to the base, the first slide block is slidably disposed on the first guide rail, the feeding assembly is fixed to the first slide block, and the first driving component is configured for driving the first slide block to slide relative to the first guide rail;
   wherein, the guide roller set is configured for feeding the adhesive material through the conduit to the nozzle.

2. The adhesive dispensing apparatus according to claim 1, wherein the position adjusting mechanism further comprises a second guide rail and a second slide block the second guide rail is disposed on the first slide block, the second slide block is slidably disposed on the second guide rail, and a sliding direction of the first slide block is different from a sliding direction of the second slide block.

3. The adhesive dispensing apparatus according to claim 2, wherein the second guide rail is fixed to the first slide block.

4. The adhesive dispensing apparatus according to claim 2, wherein the second guide rail rotatably disposed on the first slide block.

5. The adhesive dispensing apparatus according to claim 2, wherein the position adjusting mechanism further comprises a second driving component, and the second driving component configured for driving the second slide block to slide relative to the second guide rail.

6. The adhesive dispensing apparatus according to claim 1, wherein the feeding assembly further comprises a heater on the bottom of the nozzle, and the heater is configured for heating the adhesive material.

\* \* \* \* \*